United States Patent [19]
Aketagawa

[11] Patent Number: 4,968,868
[45] Date of Patent: Nov. 6, 1990

[54] PROJECTION EXPOSURE SYSTEM

[75] Inventor: Masato Aketagawa, Yokohama, Japan

[73] Assignee: Canon Kabushiki Kaisha, Tokyo, Japan

[21] Appl. No.: 453,116

[22] Filed: Dec. 22, 1989

Related U.S. Application Data

[63] Continuation of Ser. No. 192,761, May 10, 1988, abandoned.

[30] Foreign Application Priority Data

May 13, 1987 [JP] Japan ................. 62-114432

[51] Int. Cl.$^5$ ............................................ B23K 26/06
[52] U.S. Cl. ........................... 219/121.68; 219/121.62; 219/121.73
[58] Field of Search ............... 219/121.68, 121.69, 219/121.6, 121.85, 121.73, 121.74, 121.75, 121.62, 121.78, 121.82, 121.83; 372/29, 30, 23, 57; 346/108

[56] References Cited

U.S. PATENT DOCUMENTS

| | | | |
|---|---|---|---|
| 3,686,585 | 8/1972 | Javen et al. | 372/32 |
| 3,842,367 | 10/1974 | Schlossberg | 372/32 |
| 4,156,124 | 5/1979 | Macken et al. | 219/121.73 X |
| 4,619,508 | 10/1986 | Shibuya et al. | 353/122 |
| 4,703,166 | 10/1987 | Bruning | 250/201 |
| 4,734,558 | 3/1988 | Nakano et al. | 219/121.73 |
| 4,773,750 | 9/1988 | Bruning | 353/122 |
| 4,785,192 | 11/1988 | Bruning | 250/548 |
| 4,786,358 | 11/1988 | Yamazaki et al. | 219/121.69 X |
| 4,811,055 | 3/1989 | Hirose | 355/53 |

Primary Examiner—C. L. Albritton
Attorney, Agent, or Firm—Fitzpatrick, Cella, Harper & Scinto

[57] ABSTRACT

A projection exposure system is disclosed, which includes: a laser; a mask stage for supporting a photomask; a wafer stage for supporting a wafer; an illumination optical system effective to illuminate the photomask by use of a light from the laser; a projection optical system for projecting, upon the wafer, a circuit pattern formed on the photomask; an adjusting device for adjusting the wavelength to be emitted from the laser; a discharge tube disposed on a path for at least a portion of the light from the laser and being adapted to emit a predetermined line spectrum; a detecting device for detecting a change in a discharged electric current from the discharge tube; and a control device for controlling the adjusting device on the basis of an output signal from the detecting device.

34 Claims, 2 Drawing Sheets

PROJECTION EXPOSURE SYSTEM

This application is a continuation of application Ser. No. 192,761, filed May 10, 1988, now abandoned.

FIELD OF THE INVENTION AND RELATED ART

This invention relates to a projection exposure system and, more particularly, to a high-performance projection exposure system having a wavelength controlling device provided for stabilization of an oscillated wavelength.

In order to attain a further increase in density and further reduction in size of semiconductor microcircuit devices by photolithography, it is advantageous to use a deep ultraviolet light having a small diffraction effect as compared with that of a g-line light (435 nm in wavelength) which can be provided by an Hg lamp. However, when such a deep ultraviolet light is used with a semiconductor device manufacturing exposure apparatus having a reduction projection lens system, the transmission factor of the reduction projection system with respect to the deep ultraviolet light is a problem to be considered.

At present, only quartz ($SiO_2$) and fluorite ($CaF_2$) are the glass materials having sufficient transmissibility to the deep ultraviolet light having a wavelength not greater than 300 nm. As for fluorite, the workability and homogeneity are not good and, in consideration of the current lens manufacturing technique, fluorite is not a material which can be suitably used as a lens. Accordingly, it may be better to make lens elements of a reduction projection lens system only by use of quartz.

When all the lens elements of a lens system are made of quartz only, it is very difficult to correct chromatic aberration. If, therefore, the spectral bandwidth of a light from a light source has a substantial extent, the resolution (resolving power) cannot be improved irrespective that a deep ultraviolet light is used. This means that it is desirable to use such a deep ultraviolet light as having a narrower spectral bandwidth.

Under these circumstances, attention has been drawn to excimer lasers which are lasers that can provide a laser beam oscillated in the deep ultraviolet region and have large energy.

A KrF excimer laser which is a typical excimer laser provides a natural emission spectrum having a spectral bandwidth on an order of 0.5 nm. If, therefore, the KrF excimer laser is used, as it is, as a light source in an exposure apparatus, there occurs a problem of chromatic aberration in a projection lens system. Accordingly, in order to use an excimer laser as a light source for an exposure apparatus, it is necessary to narrow the spectral bandwidth of the excimer laser.

Usually, the spectral bandwidth of an excimer laser can be narrowed by use of a wavelength selecting element such as a grating, etalon or otherwise which may be incorporated into a laser resonator so that a particular wavelength component in the naturally emitted spectrum can be forcibly oscillated.

However, even where such an excimer laser as having an wavelength selecting element such as a etalon as described hereinbefore is used in an exposure apparatus, there is still a problem of shift of the wavelength emitted from the excimer laser, which shift may be caused by, for example, mechanical vibration applied to the wavelength selecting element itself, thermal expansion of the wavelength selecting element and change in atmospheric pressure. If such a shift of the wavelength occurs, the focus position of a projection lens system is displaced with a result of an adverse and critical effect upon, the resolution.

In an attempt to stabilize the wavelength from an excimer laser, a wavelength detecting means including a grating, etalon or otherwise may be used to detect any shift in the wavelength of a laser beam from an excimer laser so that the wavelength selecting element in the laser resonator may be adjusted in accordance with the detected shift in the wavelength.

However, this method still involves a problem that precise monitoring of the shift of the wavelength is not attainable where mechanical vibration, thermal expansion or change in atmospheric pressure is applied to the wavelength selecting element such as a grating, etalon or otherwise. As a result, it is difficult to accurately correct the shift of the wavelength from an excimer laser.

SUMMARY OF THE INVENTION

It is an object of the present invention to solve at least one of the problems described hereinbefore.

It is another object of the present invention to provide a projection exposure system in which the wavelength of an emitted laser can be precisely adjusted and maintained at a constant value.

Briefly, in accordance with one aspect of the present invention, to achieve at least one of these objects, there is provided a projection exposure system, comprising: a laser; a mask stage for supporting a photomask; a wafer stage for supporting a wafer; an illumination optical system effective to illuminate the photomask by use of a light from said laser; a projection optical system for projecting, upon the wafer, a circuit pattern formed on the photomask; an adjusting device for adjusting the wavelength to be emitted from said laser; a discharge tube disposed on a path for at least a portion of the light from said laser and being adapted to emit a predetermined line spectrum; detecting means for detecting a change in a discharged electric current from said discharge tube; and control means for controlling said adjusting device on the basis of an output signal from said detecting means.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
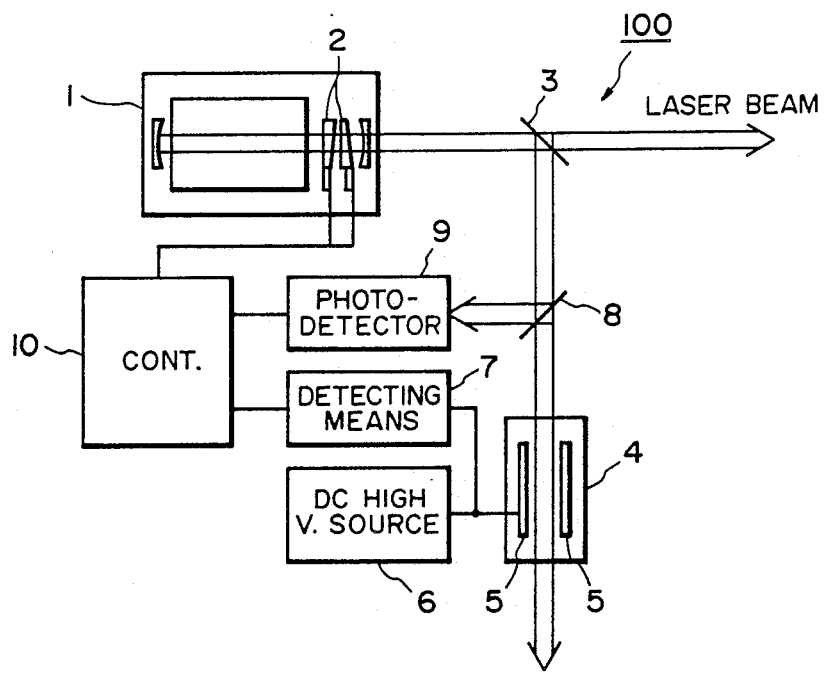
FIG. 1 is a schematic and diagrammatic view of a light source device suitably usable in a projection exposure system according to one embodiment of the present invention.

Referring first to FIG. 1, there is shown a light source device, denoted generally at 100, which can be suitably used in a projection exposure system according to one embodiment of the present invention.

In FIG. 1, denoted at 1 is a KrF excimer laser; at 2, a wavelength adjusting device which is incorporated into a resonator of the KrF excimer laser 1 and which comprises, in this embodiment, an etalon including a pair of transparent optical elements having an adjustable gap; at 3, a half mirror; at 4, a discharge tube which comprises, in this embodiment, a hollow cathode lamp wherein iron (Fe) is used for its cathode and wherein a rare gas such as He is sealingly contained in the inside space of the lamp; at 5, positive and negative electrodes; at 6, a DC high voltage electric power source; at 7, an electric current detecting means including an amplifier, for detecting a discharged electric current; at 8, a half mirror; at 9, a photodetector for detecting the intensity of the laser beam; and at 10, a controller for controlling the wavelength adjusting device 2 of the KrF excimer laser 1 on the basis of signals from the amplifier of the current detecting means 7 and the photodetector 9.

Figure 2:
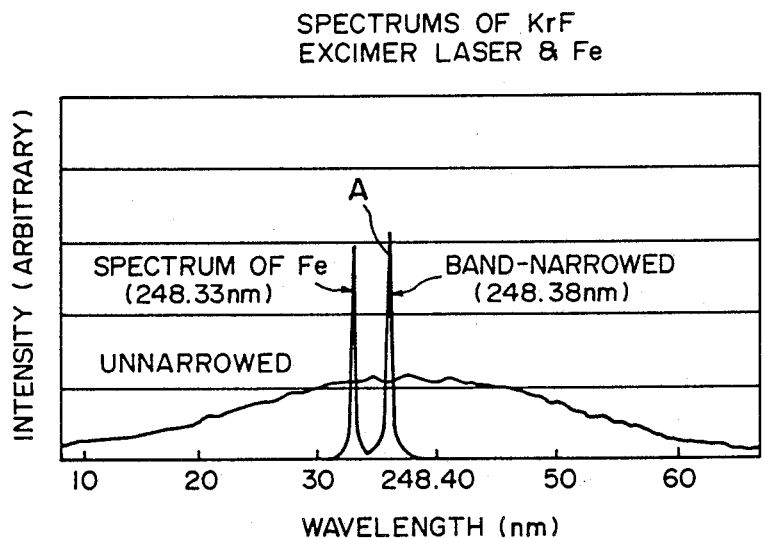
FIG. 2 is a graph showing the wavelength spectrum of a KrF excimer laser and a line spectrum of Fe.

FIG. 2 is a graph showing the wavelength and intensity of a KrF excimer laser and the line spectrum of Fe.

It is seen from FIG. 2 that, without band-narrowing, namely if no wavelength selecting element such as an etalon is incorporated into a KrF excimer laser such as at 1 in FIG. 1, the KrF excimer laser produces a spectrum which is distributed substantially continuously from 248.1 nm to 248.6 nm.

If, on the other hand, a wavelength selecting element such as an etalon is used, a band-narrowed light of a particular wavelength, having a spectrum bandwidth not greater than 0.005 nm, is forcibly oscillated. It should be noted that, by means of the wavelength adjusting device 2 of the present embodiment, the emission wavelength of such a band-narrowed light can be made variable within a wavelength range from 248.1 nm to 248.6 nm.

Referring now to FIGS. 1 and 2, the operation of the light source device will be described in detail.

The band-narrowed pulsed laser beam as emitted from the KrF excimer laser 1 is divided into two light beams by the half mirror 3. One of the split laser beams passes through the half mirror 3 and enters into an illumination system of the exposure apparatus, so that it can be used for the printing of circuit patterns on a semiconductor wafer, for the manufacture of semiconductor microcircuits. The other of the two split laser beams, as reflected by the half mirror 3, is divided again into two by the half mirror 8. One of the two split laser beams is reflected by the half mirror 8 and is projected upon the photodetector 9. The other laser beam passes through the half mirror 8 and is projected upon the hollow cathode lamp 4 which is of a see-through type wherein Fe is used for its cathode. The hollow cathode lamp 4 is electrically connected to the DC high voltage source 6 by way of the electrodes 5. Where Fe is used for a cathode, the line spectrum of Fe is emitted, such that a line spectrum of a wavelength 248.33 nm is obtainable. The DC high voltage source 6 is electrically connected to the detecting means 7 which is arranged to detect the discharged electric current. During a time period during which the hollow cathode lamp 4 is excited, the information which concerns the discharged electric current, discharged with respect to each laser beam pulse, and which is detected by the detecting means 7 is transmitted to the controller 10 in the form of an electric signal. If the wavelength of a band-narrowed laser beam such as, for example, the wavelength of the laser beam being oscillated at the wavelength 248.38 nm (as in the FIG. 2 example) is shifted by the wavelength adjusting device 2 in a direction denoted by arrow A in FIG. 2 and, as a result of which, the wavelength of the laser beam becomes coincident with the line spectrum 248.33 nm of the Fe, described above, then the discharged electric current from the hollow cathode lamp changes (e.g. reduces) by an effect which is called "opto-galvano effect". The detecting means 7 detects such an opto-galvano discharging electric current, and the value detected by the detecting means 7 is transmitted to the controller 10. Since the change in such a discharged electric current is also proportional to the intensity of the laser beam, the information concerning the intensity of each laser beam pulse as detected by the photodetector 9 is transmitted to the controller 10. By use of these two kinds of information, the controller 10 compares the actually detected discharged electric current I with an opto-galvano discharging electric current Imax at a corresponding laser beam intensity, as having been stored in the controller. Thereafter, the controller 10 controls the wavelength adjusting device 2 in accordance with a predetermined sequence so that a maximum opto-galvano effect is always assured, namely Imax=I is retained.

With this arrangement, the wavelength of a KrF excimer laser can be retained at the line spectrum 248.33 nm of Fe and, independently of vibration or temperature change, the wavelength can be retained within the range of the line spectrum of Fe.

In the laser light source device 100 of the present embodiment, Fe is used for the cathode of the hollow cathode lamp 4. However, an Hg material may be used in place of Fe, as such a cathode. In such a case, the wavelength adjusting device may be controlled so that the wavelength of a KrF excimer laser can be held at the line spectrum 248.382 nm of Hg.

In the FIG. 1 example described hereinbefore, the cathode of a discharge tube is formed by such a material as having a line spectrum which is close to an emittable wavelength of a laser used in a projection exposure system. This discharge tube is disposed on a path for at least a portion of a light from the laser. The wavelength of the laser is adjusted on the basis of the change in the discharged electric current, based on the opto-galvano effect, so that the wavelength of the laser coincides with the line spectrum. By doing so, it is possible to continuously supply a laser beam with the wavelength thereof being stabilized.

Figure 3:
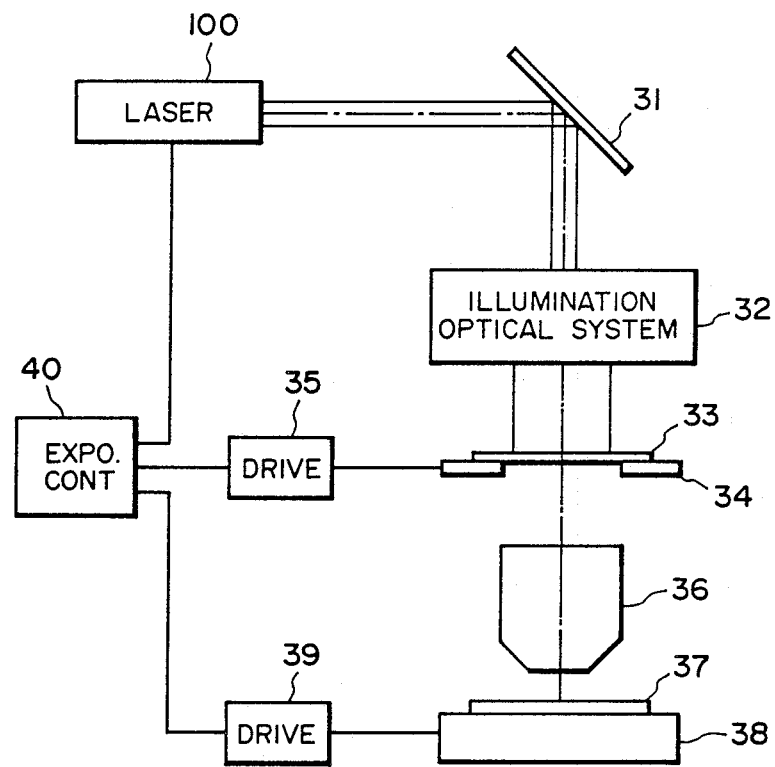
FIG. 3 is a schematic and diagrammatic view of an example of a projection exposure system into which the light source device shown in FIG. 1 can be incorporated.

FIG. 3 shows an example of a projection exposure system into which the laser light source device shown in FIG. 1 is suitably incorporated.

In FIG. 3, denoted at 100 is a laser light source device of the type shown in FIG. 1, being adapted to supply a band-narrowed excimer laser beam having a central wavelength of 248.33 nm. Denoted at 31 is a total reflection mirror; and at 32 is an illumination optical system. The excimer laser beam from the laser light source 100 is reflected by the total reflection mirror 31 and is directed to the illumination optical system 32. The illumination optical system 32 is arranged to expand the beam diameter of the excimer laser beam and to illuminate, by use of such an expanded excimer laser beam, a surface to be illuminated (which may be a photomask surface as described later). Additionally, the illumination optical system 32 includes an optical arrangement effective to reduce or suppress interference fringes which might be caused upon the surface, being illuminated, due to the coherency of the excimer laser beam. An example of such an illumination optical system is disclosed in U.S. Pat. No. 4,619,508.

Denoted at 33 is a mask having a circuit pattern formed thereon. The mask 33 is placed on a mask stage 34 which is movable in a plane perpendicular to the optical axis of the illumination optical system 32. The mask stage 34 is moved by means of a stage driver 35. Denoted at 36 is a reduction projection lens system having plural lens elements all of which are made of quartz ($SiO_2$). The reduction projection lens system 36 has a reducing magnification which is set within a range of 1/5-1/20. Also, the reduction projection lens system has been designed for use with a wavelength of 248.33 nm, described above, as a design wavelength. Denoted at 37 is a wafer having a surface which is coated with a resist material having a sufficient sensitivity to the excimer laser beam. The wafer 37 is placed on a wafer stage 38 which is made movable in the direction of the optical axis of the projection lens system 36 and also in a plane perpendicular to this optical axis. The wafer stage 38 is moved by means of a stage driver 39.

When in operation the mask 33 is illuminated by the illumination optical system 32 by use of the excimer laser beam, the circuit pattern of the mask 33 is projected by the reduction projection lens system 36 upon a predetermined exposure region on the wafer 37. After completion of the transfer of the circuit pattern onto said predetermined exposure region, the wafer stage 38 is moved by a predetermined amount so that the next exposure region on the wafer 37 is positioned just underneath the projection lens system 36. Then, the circuit pattern of the mask is transferred onto the thus positioned exposure region on the wafer. Such operation is repeated until the circuit pattern of the mask is transferred onto every one of the plural and different exposure regions on the wafer 37.

The stage drivers 35 and 39 and the laser light source 100 are electrically connected to an exposure controlling unit 40 by way of respective signal lines, so that the above-described operations are controlled under the influence of the controlling unit 40.

Since, in the projection exposure system of the present embodiment, the laser light source device 100 is arranged so as to constantly supply an excimer laser beam of a wavelength 248.33 nm, as described hereinbefore, there occurs no problem of shift of the focus position of the projection lens system 36 or other optical aberrations, for example. Accordingly, the circuit pattern of the mask 33 can be accurately transferred onto the wafer 37 and, as a result of which, production of defective semiconductor devices can be avoided.

While, in the foregoing examples, a wavelength adjusting device incorporated into a resonator of a KrF excimer laser uses an etalon, other wavelength selecting element such as, for example, a grating or a prism may of course be used.

In accordance with the present invention, as has hitherto been described, the emission wavelength of a light source such as, for example, a KrF excimer laser can be held and, therefore, stabilized at the line spectrum 248.33 nm of Fe or the line spectrum 248.382 nm of Hg, for example. Accordingly, it is possible to correctly preclude the fluctuation in the emission wavelength which may otherwise be caused by the vibration, thermal expansion or change in atmospheric pressure, applied to a wavelength selecting element which is incorporated into a light source such as a KrF excimer laser.

As a result, the shift of the focus position of a projection lens system can be minimized and the deterioration of the resolution due to the chromatic aberration can be prevented sufficiently. Therefore, by the present invention, it becomes possible to provide a high-performance projection exposure system.

While the invention has been described with reference to the structures disclosed herein, it is not confined to the details set forth and this application is intended to cover such modifications or changes as may come within the purposes of the improvements or the scope of the following claims.

What is claimed is:

1. A projection exposure system, comprising:
   a pulse laser;
   a mask stage for supporting a photomask;
   a wafer stage for supporting a wafer;
   an illumination optical system for illuminating the photomask with a pulse laser beam from said pulse laser;
   a projection optical system for projecting on the wafer an image of a pattern formed on the photomask as illuminated with the laser beam pulse;
   a discharge tube for emitting a predetermined line spectrum by discharging, said discharge tube receiving a laser beam from said pulse laser and discharging current which varies with the wavelength of the received laser beam, said discharge tube comprising means for producing a first signal corresponding to the discharged current;
   a voltage source for applying a DC voltage to said discharge tube and for causing said discharge tube to discharge the current;
   photoelectric converting means for producing a second signal corresponding to the intensity of a received laser beam pulse;
   dividing means for dividing a laser beam pulse and for forming first and second laser beam pulses, said dividing means comprising means for directing the first laser beam pulse to said discharge tube and means for directing the second laser beam pulse to said photoelectric converting means;
   adjusting means for adjusting the wavelength of the laser beam pulse from said pulse laser; and
   control means for controlling said adjusting means on the basis of the first and second signals, so that the laser beam pulse from said pulse laser has a predetermined wavelength.

2. A system according the claim 1, wherein said control means controls said adjusting means so that the laser beam pulse has substantially the same wavelength as the line spectrum from said discharge tube.

3. A system according to claim 2, wherein said laser comprises a KrF excimer laser and wherein said line spectrum is a line spectrum of Fe having a wavelength of 248.33 nm.

4. A system according to claim 2, wherein said laser comprises a KrF excimer laser and wherein said line spectrum is a line spectrum of Hg having a wavelength of 248.382 nm.

5. A system according to claim 1, wherein said dividing means comprises first and second beam splitters, said first beam splitter being adapted to divide the laser beam pulse from said pulse laser to direct one of the divided laser beam pulses to said illumination optical system and to direct the other laser beam pulse to said second beam splitter, and wherein said second beam splitter is adapted to divide the received other laser beam pulse to provide the first and second laser beam pulses.

6. A system according to claim 1, wherein said adjusting means comprises a band narrowing means for narrowing a bandwidth of the laser beam pulse from said pulse laser.

7. A system according to claim 6, wherein said pulse laser comprises a resonator and wherein said band narrowing means is accommodated in said resonator.

8. A laser device, comprising:
a resonator comprising a band narrowing element, for producing a pulse laser beam having a narrow bandwidth;
a discharge tube for emitting by discharging, a predetermined line spectrum, said discharge tube being adapted to receive the laser beam from said resonator and to discharge an electric current which varies with the wavelength of the received laser beam;
a voltage source for applying a DC voltage to said discharge tube; and
adjusting means responsive to a change in the discharged current, for adjusting said band narrowing element so that the wavelength of the laser beam is controlled to be substantially equal to the wavelength of the line spectrum.

9. A device according to claim 8, further comprising a beam splitter for dividing the laser beam from said resonator and photoelectric converting means for producing a signal corresponding to the intensity of a received laser beam, wherein one of the laser beams divided by said beam splitter is directed to said discharge tube while another laser beam is directed to said photoelectric converting means, and wherein said adjusting means is operable to execute the adjustment on the basis of a change in current discharged and of the signal produced from said photoelectric converting means.

10. A device according to claim 9, wherein said resonator is adapted to emit a KrF excimer laser beam and wherein said discharge tube is adapted to emit an Fe line spectrum.

11. A device according to claim 9, wherein said resonator is adapted to emit a KrF excimer laser beam and wherein said discharge tube is adapted to emit an Hg line spectrum.

12. A laser device, comprising:
a resonator comprising a band narrowing element for producing a laser beam of narrow bandwidth;
a beam splitter for dividing the laser beam and for forming first and second laser beams;
receiving means for receiving the first laser beam and for producing a signal corresponding to the intensity of the received first laser beam;
a discharge tube for emitting by discharging, a predetermined line spectrum, said discharge tube comprising means for receiving the second laser beam and means for discharging electric current which varies with the wavelength of the received second laser beam;
a voltage source for applying electric voltage to said discharge tube for the discharging thereof; and
adjusting means responsive to a change in the discharged current and the produced signal for adjusting said band narrowing element so that the laser beam is controlled to have substantially the same wavelength as the line spectrum.

13. A device according to claim 12, wherein said resonator is adapted to emit a KrF excimer laser beam and wherein said discharge tube is adapted to emit an Fe line spectrum.

14. A device according to claim 12, wherein said resonator is adapted to emit a KrF excimer laser beam and wherein said discharge tube is adapted to emit an Hg line spectrum.

15. A laser device, comprising:
a resonator comprising a band narrowing element for producing a laser beam having a narrow bandwidth;
a discharge tube for emitting by discharging, a predetermined line spectrum, said discharge tube comprising means for receiving a laser beam from said resonator and means for discharging current which varies with the wavelength of the received laser beam;
means for applying an electric voltage to said discharge tube for discharging thereof;
means for detecting the current discharged from said discharge tube; and
adjusting means responsive to a signal from said detecting means, for adjusting said band narrowing element so that the laser beam is controlled to have substantially the same wavelength as the line spectrum.

16. A device according to claim 15, wherein said resonator is adapted to emit a KrF excimer laser beam and wherein said discharge tube is adapted to emit an Fe line spectrum.

17. A device according to claim 16, wherein said resonator is adapted to emit a KrF excimer laser beam and wherein said discharge tube is adapted to emit an Hg line spectrum.

18. A method of adjusting the wavelength of laser radiation, comprising the steps of:
directing laser radiation from a radiation source device to a discharge tube adapted to emit a line spectrum of a predetermined wavelength by discharging;
detecting a discharge current from a discharge tube as the tube is irradiated with the laser radiation; and
adjusting the radiation source device on the basis of the detection so that the wavelength of the laser radiation is controlled to be substantially equal to the predetermined wavelength.

19. A method according to claim 18, wherein said adjusting step comprises adjusting a band narrowing arrangement to change the wavelength of the laser radiation for narrowing the bandwidth of the laser radiation from the radiation source.

20. A method according to claim 19, further comprising using a radiation source device including a radiation source adapted to emit a KrF excimer laser beam and a discharge tube adapted to emit an Fe line spectrum.

21. A method according to claim 19, further comprising using a radiation source device including a radiation source adapted to emit a KrF excimer laser beam and a discharge tube adapted to emit an Hg line spectrum.

22. A method according to claim 19, further comprising using a radiation source device including a radiation source emitting pulsed laser radiation, and applying a DC voltage to the discharge tube for producing a discharged current and emitting the line spectrum of the predetermined wavelength.

23. A method according to claim 19, further comprising detecting the intensity of the laser radiation, and wherein the adjusting is made on the basis of the detection of the discharge current and the detection of intensity of the laser radiation.

24. A method of exposure of a wafer with laser radiation, comprising the steps of:
   directing laser radiation from a radiation source device to a discharge tube emitting a predetermined line spectrum by discharging;
   detecting current discharged from a discharge tube as the tube is irradiated with laser radiation;
   adjusting the radiation source device on the basis of the detection so that the wavelength of the laser radiation is controlled to be substantially equal to the wavelength of the line spectrum from the discharge tube; and
   directing the wavelength adjusted laser radiation through a projection optical system to the wafer to expose the wafer with the wavelength adjusted laser radiation.

25. A method according to claim 24, further comprising using a radiation source device including a band narrowing arrangement for narrowing the bandwidth of laser radiation emerging therefrom, and adjusting the radiation source device by adjusting the band narrowing arrangement to change the wavelength of the laser radiation.

26. A method according to claim 25, and further comprising using a radiation source device including a radiation source which comprises a KrF excimer laser.

27. A method of adjusting the wavelength of a laser pulse comprising the steps of:
   directing a laser pulse from a radiation source to a discharge tube to emit a line spectrum of a predetermined wavelength by discharging;
   applying a DC voltage to the discharge tube to cause the discharging;
   detecting a change in discharge current of the discharge tube while being irradiated with the laser pulse; and
   adjusting the radiation source on the basis of the detection in the detecting step to control the wavelength of the laser pulse to be substantially equal to the predetermined wavelength.

28. A method according to claim 27, wherein said adjusting step comprises adjusting a band narrowing arrangement to change the wavelength of the laser radiation to narrow the bandwidth of the laser radiation from the radiation source.

29. A method according to claim 28, wherein said directing step comprises directing a laser pulse from a radiation source emitting a KrF excimer laser beam to a discharge tube emitting an Fe line spectrum.

30. A method according to claim 28, wherein said directing step comprises directing a laser pulse from a radiation source emitting a KrF excimer laser beam to a discharge tube emitting an Hg line spectrum.

31. A method of adjusting the wavelength of laser radiation comprising the steps of:
   splitting laser radiation from a radiation source into a first laser beam and a second laser beam;
   a first detecting step for detecting intensity of the first laser beam;
   directing the second laser beam to a discharge tube to emit a line spectrum of a predetermined wavelength by discharging;
   a second detecting step for detecting a change in discharge current of the discharge tube while being irradiated with the second laser beam; and
   adjusting the radiation source on the basis of the detections in the first and second detecting steps to control the wavelength of the laser radiation to be substantially equal to the predetermined wavelength.

32. A method according to claim 31, wherein said adjusting step comprises adjusting a band narrowing arrangement to change the wavelength of the laser radiation to narrow the bandwidth of the laser radiation from the radiation source.

33. A method according to claim 32, wherein said splitting step comprises splitting laser radiation from a radiation source emitting a KrF excimer laser beam for direction to a discharge tube emitting an Fe line spectrum.

34. A method according to claim 32, wherein said splitting step comprises splitting laser radiation from a radiation source emitting a KrF excimer laser beam for direction to a discharge tube emitting an Hg line spectrum.

* * * * *

UNITED STATES PATENT AND TRADEMARK OFFICE
CERTIFICATE OF CORRECTION

PATENT NO. : 4,968,868

DATED : November 6, 1990

INVENTOR(S) : Masato Aketagawa

It is certified that error appears in the above-identified patent and that said Letters Patent is hereby corrected as shown below:

COLUMN 6

Line 49, "the" should read --to--.

COLUMN 8

Line 64, "charged" should read --charge--.

Signed and Sealed this

Twenty-third Day of June, 1992

Attest:

DOUGLAS B. COMER

*Attesting Officer*   *Acting Commissioner of Patents and Trademarks*